(12) United States Patent
Kim et al.

(10) Patent No.: US 8,531,647 B2
(45) Date of Patent: Sep. 10, 2013

(54) EXPOSURE METHOD AND EXPOSURE APPARATUS FOR PHOTOSENSITIVE FILM

(75) Inventors: Jong Il Kim, Gyeonggi-do (KR); Byung Duck Song, Seoul (KR); Jong Dam Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 968 days.

(21) Appl. No.: 12/216,704

(22) Filed: Jul. 9, 2008

(65) Prior Publication Data

US 2009/0168035 A1 Jul. 2, 2009

(30) Foreign Application Priority Data

Dec. 31, 2007 (KR) .................. 10-2007-0141751

(51) Int. Cl.
*G03B 27/42* (2006.01)
*H01L 33/00* (2010.01)
*G03F 7/20* (2006.01)

(52) U.S. Cl.
CPC .................................. *G03F 7/7005* (2013.01)
USPC ............................................... 355/53; 257/91

(58) Field of Classification Search
CPC .......................... G03F 7/70025; G03F 7/7005
USPC ................. 355/53, 67, 69, 70; 257/88, 433, 257/79, 91, 98, 100
See application file for complete search history.

(56) References Cited

U.S. PATENT DOCUMENTS

| | | | |
|---|---|---|---|
| 4,271,408 A | | 6/1981 | Teshima et al. |
| 4,786,947 A | * | 11/1988 | Kosugi et al. ............... 355/30 |
| 5,632,551 A | * | 5/1997 | Roney et al. ................. 362/485 |
| 6,115,184 A | * | 9/2000 | Hubble et al. ................ 359/627 |
| 6,219,074 B1 | * | 4/2001 | Chosa et al. .................. 347/130 |
| 6,233,039 B1 | * | 5/2001 | Yen et al. ........................ 355/53 |
| 6,885,035 B2 | * | 4/2005 | Bhat et al. ........................ 257/99 |
| 7,119,826 B2 | * | 10/2006 | Nojima et al. ................. 347/244 |
| 2002/0054282 A1 | * | 5/2002 | Sasaya et al. .................... 355/53 |
| 2002/0171047 A1 | * | 11/2002 | Chan et al. .................... 250/492.1 |
| 2005/0218468 A1 | | 10/2005 | Owen et al. ................... 257/433 |
| 2005/0219493 A1 | * | 10/2005 | Oshida et al. .................... 355/67 |
| 2007/0253188 A1 | * | 11/2007 | Klipstein et al. .............. 362/105 |
| 2008/0284999 A1 | * | 11/2008 | Thallner ........................ 355/53 |
| 2009/0002669 A1 | * | 1/2009 | Liu et al. ......................... 355/67 |

FOREIGN PATENT DOCUMENTS

| | | |
|---|---|---|
| JP | S55-053391 | 4/1980 |
| JP | S61-127654 U | 8/1986 |
| JP | S62-055973 | 3/1987 |
| JP | 62-149180 A | 7/1987 |

(Continued)

OTHER PUBLICATIONS

Japanese Office Action from counterpart JP App No. 2008-170535 dated Jul. 5, 2011.

(Continued)

*Primary Examiner* — Steven H Whitesell Gordon
(74) *Attorney, Agent, or Firm* — Morgan, Lewis & Bockius LLP

(57) ABSTRACT

An exposure apparatus for a photosensitive film includes: light-emitting diodes for generating rays to expose a photosensitive film; a light shield positioned between the light-emitting diodes to prevent noise; a stage for receiving a substrate having the photosensitive film thereon; and a parallelizer positioned between the light-emitting diodes and the stage for redirecting the rays from the light-emitting diodes to be perpendicularly incident upon the photosensitive film.

12 Claims, 13 Drawing Sheets

(56) References Cited

FOREIGN PATENT DOCUMENTS

| | | |
|---|---|---|
| JP | H04-056985 | 2/1992 |
| JP | 05-019705 F1 | 1/1993 |
| JP | H06-186911 | 7/1994 |
| JP | H08-234071 | 9/1996 |
| JP | 2001-320090 A | 11/2001 |
| JP | 2002-223005 | 8/2002 |
| JP | 2003-218000 | 7/2003 |
| JP | 2004-274011 | 9/2004 |
| JP | 2004-335937 | 11/2004 |
| JP | 2005-167018 | 6/2005 |
| JP | 2006-059607 | 3/2006 |
| JP | 2007-136720 | 6/2007 |
| JP | 2007-200869 | 8/2007 |
| TW | 200417825 | 9/2004 |
| WO | WO 2006064363 A1 * | 6/2006 |

OTHER PUBLICATIONS

Taiwanese Office Action issued in corresponding Taiwanese patent application No. 097140521 dated Oct. 18, 2012.

JPO—Office Action—Japanese Patent Application No. 2008-170535—Issued on Jan. 22, 2013.

* cited by examiner

EXPOSURE METHOD AND EXPOSURE APPARATUS FOR PHOTOSENSITIVE FILM

This application claims the benefit of Korean Patent Application No. 2007-0141751, filed on, Dec. 31, 2007, which is hereby incorporated by reference in its entirety.

BACKGROUND OF THE INVENTION

1. Field of the Invention

Embodiments of the invention relate to a photosensitive film, and more particularly, to an exposure method and exposure apparatus for a photosensitive film.

2. Discussion of the Related Art

Recently, various flat panel displays have been developed that solve the disadvantages of a cathode ray tube, such as heavy weight and large volume. Accordingly, the use of such flat panel displays is on the rise. These flat panel displays include a liquid crystal display, a field emission display, a plasma display panel, and an electro-luminescence display.

The thin films of these flat panel displays are formed by a plurality of mask processes. Each of the mask processes includes a thin film depositing (coating) process, a washing process, a photolithography process, an etching process, a photoresist removing process, and a testing/inspection process. More particularly, the photolithography process includes an applying process, in which a photosensitive film is applied onto a thin film formed on a substrate, an exposing process, in which the photosensitive film is exposed to light using a mask, and a developing process, in which the exposed photosensitive film is developed.

A related art exposure apparatus, which is used in the exposing process, exposes a photosensitive film using ultraviolet light generated from a mercury discharge lamp, for example. However, the discharge lamp of the related art exposure apparatus has a short life of only 1000 hours, which requires work stoppage whenever the discharge lamp is replaced, such that expenses are incurred due to both lamp replacement and lost production. Work stoppage is long because of a cooling period for the discharge lamp to dissipate the 1200° C. operating heat, actual replacement time, and recalibration time to properly position a replacement discharge lamp.

Light from the discharge lamp of the related art exposure apparatus include wavelengths of light unnecessary for exposure. Accordingly, the related art exposure apparatus requires an optical filter to filter out the unnecessary wavelength of light, and thus the related art exposure apparatus has a complex structure and large size. Further, the discharge lamp of the related art exposure apparatus must be maintain in an on-state to prevent the generation of cracks due to thermal stresses caused by frequently turning the lamp off and on. A shutter is additionally provided to block light emission when the discharge lamp of the related art exposure apparatus is not in use. Because the discharge lamp is maintained in the on-state, the related art exposure apparatus wastes electricity. Moreover, the discharge lamp of the related art exposure apparatus contains substances, such as mercury, that are harmful to the environment and thus additional disposal expenses are incurred in using the discharge lamp of the related art exposure apparatus.

SUMMARY OF THE INVENTION

Accordingly, embodiments of the invention are directed to an exposure method and exposure apparatus for a photosensitive film.

One object of embodiments of the invention is to provide an exposure apparatus that costs less and operates more efficiently.

Another object of embodiments of the invention is to provide an exposure method for exposing a photosensitive film at less cost and more efficiently.

Another object of embodiments of the invention is to provide a method for patterning a photosensitive film at less cost and more efficiently.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, an exposure apparatus for a photosensitive film includes: light-emitting diodes for generating rays to expose a photosensitive film; a light shield positioned between the light-emitting diodes to prevent noise; a stage for receiving a substrate having the photosensitive film thereon; and a parallelizer positioned between the light-emitting diodes and the stage for redirecting the rays from the light-emitting diodes to be perpendicularly incident upon the photosensitive film.

In another aspect, an exposure method for a photosensitive film includes: providing a substrate with a photosensitive film on a stage; and controlling the optical output of each diode of a light-emitting diode array to generate rays that are redirected by a parallelizer positioned between the light-emitting diodes and the stage to be perpendicularly incident upon the photosensitive film.

In another aspect, a patterning method for a photosensitive film includes: providing a substrate with a photosensitive film on a stage; providing a mask between the photosensitive film and a light-emitting diode array; controlling the optical output of each diode of a light-emitting diode array to generate rays that are redirected by a parallelizer positioned between the light-emitting diodes and the projection optical system; and providing a projection optical system between the mask and the photosensitive film to revises the rays from the mask in consideration of contraction/expansion degree of the substrate.

It is to be understood that both the foregoing general description and the following detailed description of embodiments of the invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the invention, examples of which are illustrated in the accompanying drawings. Wherever possible, the same reference numbers will be used throughout the drawings to refer to the same or like parts.

Figure 1:
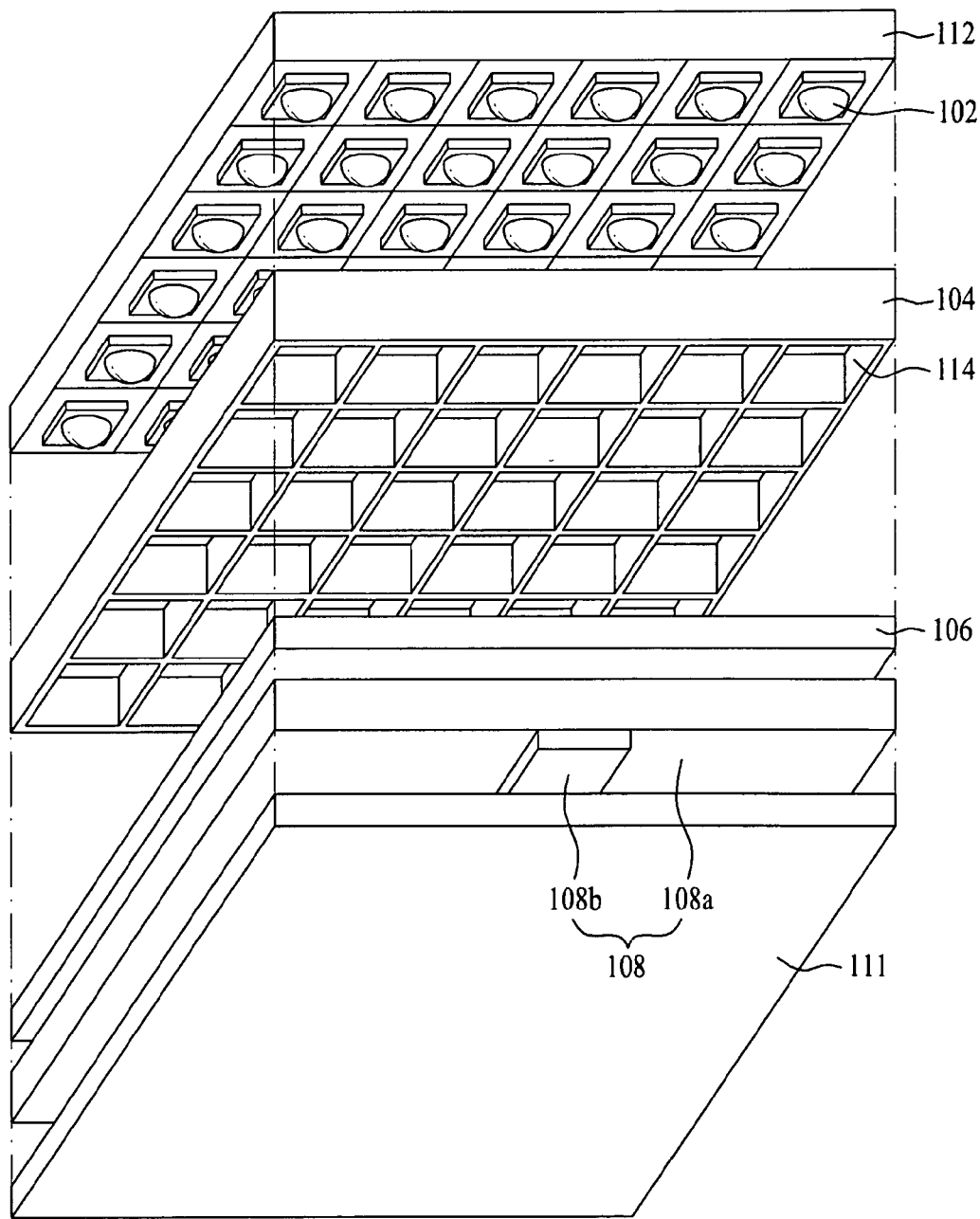
FIG. 1 is a perspective view of an exposure apparatus in accordance with a first embodiment of the invention.
Figure 2:
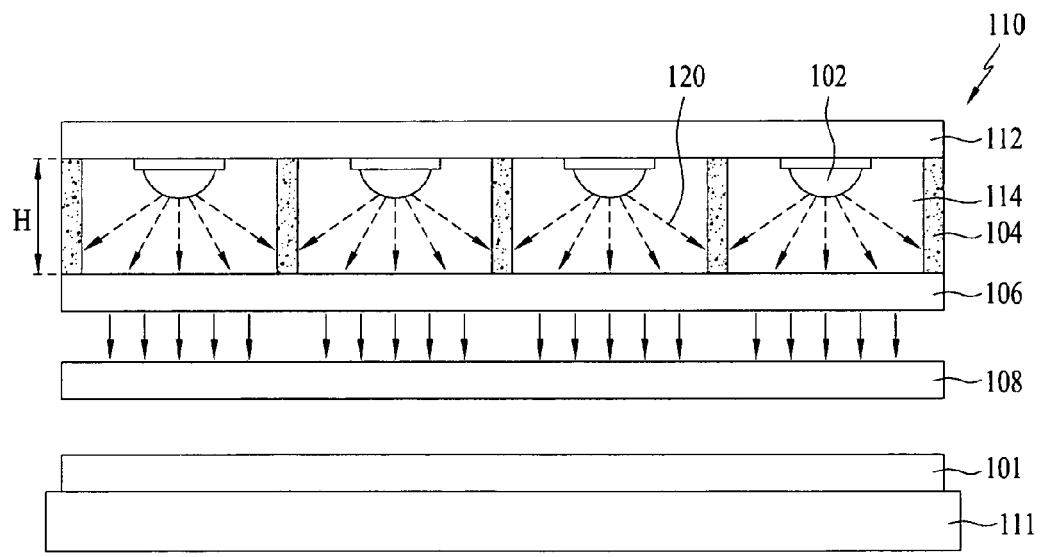
FIG. 2 is a cross-sectional view of the exposure apparatus shown in FIG. 1.

FIG. 1 is a perspective view of an exposure apparatus in accordance with a first embodiment of the invention, and FIG. 2 is a cross-sectional view of the exposure apparatus shown in FIG. 1. As shown in FIGS. 1 and 2, an exposure apparatus 110 includes light-emitting diodes (LEDs) 102 in a matrix array, a light shielding film 104, a parallelizer 106, a mask 108, and a stage 111 opposite to the mask 108. The stage 111 supports a substrate 101, onto which a photosensitive film (not shown) is applied.

The LEDs 102 are mounted on a printed circuit board 112, which is made of a heat-radiating material, which dissipates heat generated from the LEDs 102. The LEDs 102 can be concurrently turned on and off, or be separately turned on and off to generate rays for exposing the photosensitive film. That is, the LEDs 102 generate rays of a short wavelength, which are used in an exposing process, for example, ultraviolet rays of a wavelength of 100~400 nm. As described above, the LEDs 102 use rays of a short wavelength, and thus do not require an optical filter for filtering out unnecessary long wavelengths of rays or a shutter. Accordingly, the exposure apparatus of embodiments of the invention have a simple structure, and thus reduces costs and has a smaller overall size.

The LEDs 102 have a lifetime of tens of thousands to hundreds of thousands of hours so as to maintain production by drastically reducing the occurrence of work stoppage periods. Since the LEDs 102 are capable of being separately turned on and off, the LEDs 102 corresponding to exposure regions of the photosensitive film can be turned on and the LEDs 102 corresponding to non-exposure regions of the photosensitive film can be left turned off so as to selectively expose the photosensitive film to light. Because the LEDs 102 are capable of being turned on and off so that the LEDs 102 can be turned on only when light is needed, power consumption can be reduced. Moreover, the LEDs 102 do not use harmful substances, such as mercury, and thus are environmentally benign.

As shown in FIG. 2, the light shielding film 104 is a lattice shape with walls between the LEDs 102 in the matrix array. The walls of the light shielding film 104 extend to a height H above the printed circuit board 112. The walls of the light shielding film 104 divides the matrix of LEDs 102 into light emitting regions 114 each having a respective one of the LEDs 102. The height H of the light shielding film 104 prevents unwanted rays 120 having a relatively low uniformity and minimizes the collimation half angle. More specifically, the light shielding film 104 shields the unwanted rays emitted from the neighboring light emitting regions 114 to prevent incidence of light upon a surface of the substrate other than light from a light emitting region 114 directly over the surface of the substrate. When the unwanted rays 120 of the respective LEDs 102 are incident upon the light emitting regions 114 of the neighboring LEDs 102, the unwanted rays 120 act as noise. Thus, the light shielding film 104 is made of a light absorptive material.

The parallelizer 106 redirects the rays from the respective LEDs 102 into rays, which are parallel with the thickness direction of the substrate 101 such that the rays from the LEDs 102 are perpendicularly incident upon the mask 108 and the photosensitive film (not shown) on the surface of the substrate 101. The parallelizer 106 is made of a material, which can pass a wavelength reacting with the photosensitive film formed on the substrate 101. For example, the parallelizer 106 is made of a transparent material having a high light transmittance, such as quartz, glass, acryl, polymethyl methacrylate (PMMA), polycarbonate, or silicon. The parallelizer 106 is a lens array including plural optical lenses 116, which are formed separately or are integrated. The plural optical lenses 116 are formed in a curved surface such that the surfaces of the optical lenses 116 opposite to the mask 108 are protuberant toward the mask 108. The plural optical lenses 116 are formed in at least one structure among the structures shown in FIGS. 3A to 3C.

Figure 3A:
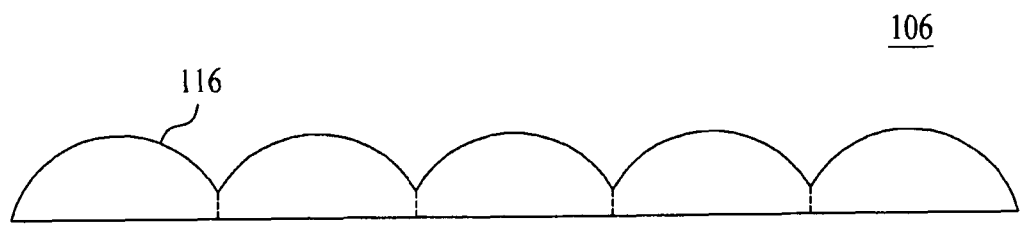
FIGS. 3A to 3C are cross-sectional views of embodiments of a parallelizer shown in FIG. 2.
Figure 3B:
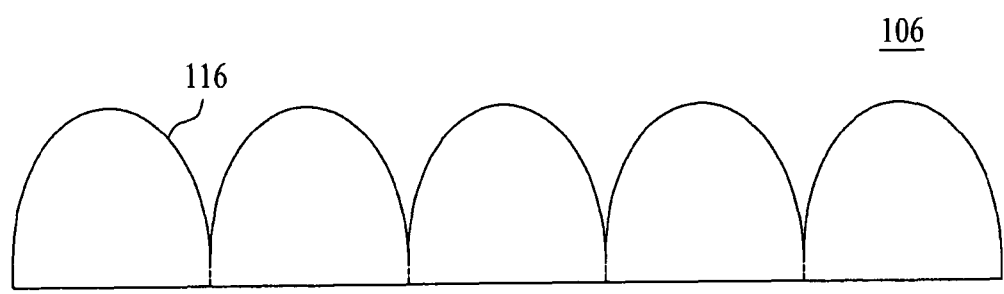
Figure 3C:
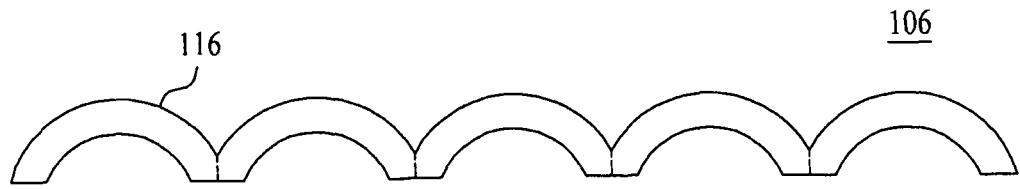

The optical lenses 116 of FIG. 3A have spherical surfaces in regions corresponding to the respective LEDs 102. The optical lenses 116 of FIG. 3B have aspherical surfaces in regions corresponding to the respective LEDs 102. The optical lenses 116 of FIG. 3C are configured such that the rear surfaces of the optical lenses 116 opposite to the LEDs 102 and as the front surfaces of the optical lenses 116 opposite to the mask 108 are protuberant toward the mask 108. The plural optical lenses 116 can correspond to the respective LEDs 102 in a one to one relationship, or correspond to the respective LEDs 102 in a one to many relationship. Although this embodiment describes the parallelizer 106, which can be one lens array out of the lens arrays shown in FIGS. 3A to 3C, the parallelizer 106 may be a combination of at least the same two lens arrays among the lens arrays shown in FIGS. 3A to 3C, or a combination of at least different two lens arrays among the lens arrays shown in FIGS. 3A to 3C.

Figure 4:
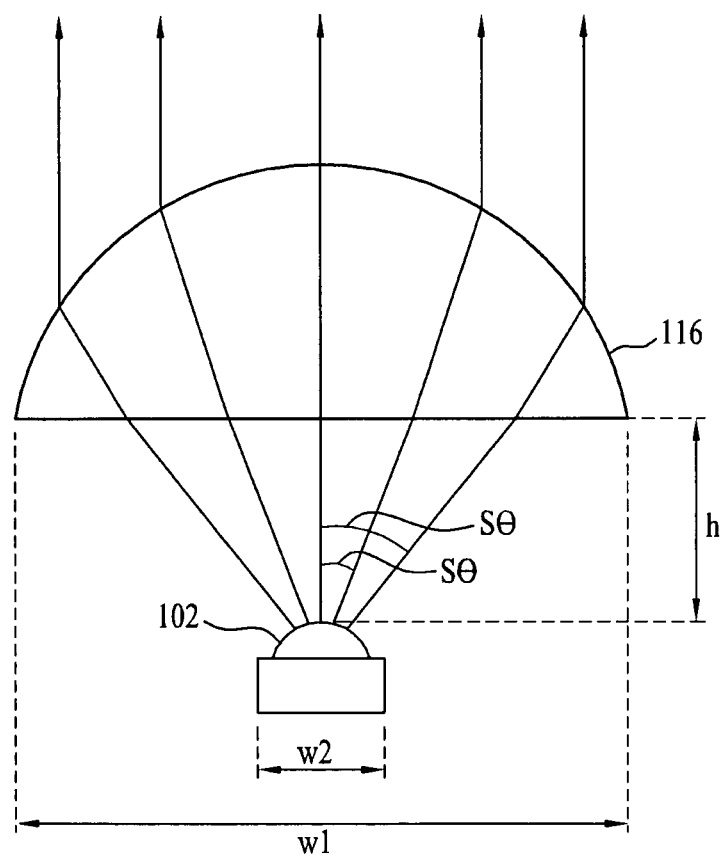
FIG. 4 is a cross-sectional view for illustrating the generation of parallel rays from the parallelizer shown in FIG. 2.

As shown in FIG. 4, incident rays are first refracted by the rear surface of the optical lens 116, and then secondarily refracted by the front surface of the optical lens 116, thus being redirected into rays that are parallel with the light shielding film 104. The optical lens 116 has a refraction index and a radius of curvature, which are determined by Snell's law, so as to redirect the incident rays from the LEDs 102 into rays parallel with the light shielding film 104 surrounding the LEDs 102 or perpendicularly toward the surface of the substrate 101. Further, to adjust light transmittance, the surface of the optical lens 116 can be coated.

The optical lenses 116 have a designated separation distance (h) with the LEDs 102 and a designated width (w1) such that the unwanted rays among the rays emitted from the LEDs 102 cannot be incident upon the optical lenses 116 and only effective rays can be incident upon the optical lenses 116. Particularly, the width (w1) of the optical lenses 116 is larger than the width (w2) of the LEDs 102. In the case that the width (w1) of the optical lenses 116 is not larger than the width (w2) of the LEDs 102, effective rays having a large spreading angle (Sθ) among the effective rays emitted from the LEDs 102 are not incident upon the optical lenses 116 but only effective rays having a small spreading angle (Sθ) are incident upon the optical lenses 116, and thus optical efficiency is lowered.

When the temperature is increased, the optical lenses 116 of the parallelizer 106 expand such that the radius of curvature of the optical lenses 116 changes. Thus, the exposure apparatus should be maintained within a predetermined operating temperature range. For this reason, a temperature sensor for sensing the temperature of the exposure apparatus can be placed on the printed circuit board 112 and a temperature control unit for increasing or decreasing the temperature of the exposure apparatus according to the sensed temperature can be additionally provided.

Figure 5:
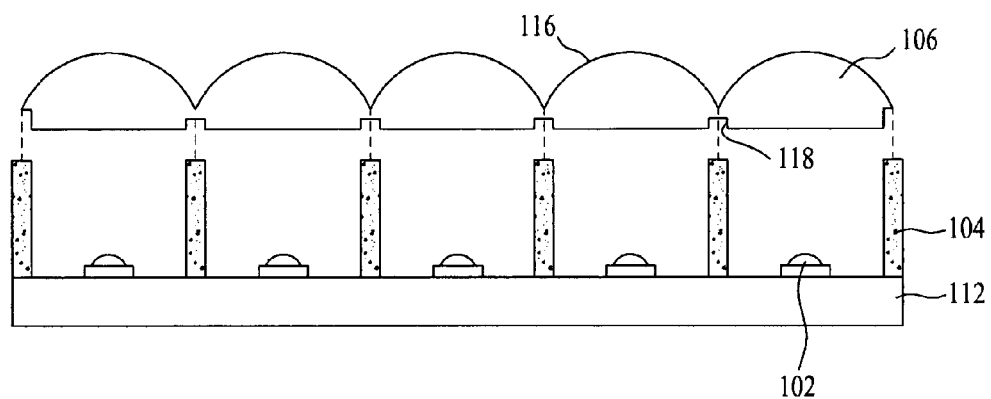
FIG. 5 is a cross-sectional view for illustrating the connecting relation between the parallelizer shown in FIG. 2 and a light shielding film.

The parallelizer 106 can be affixed to the light shielding film 104 and then the light shielding film 104 is positioned above the printed circuit board 112. In another alternative, the light shielding film 104 is attached to the printed circuit board 112 and then the parallelizer 106 is positioned above the light shielding film 104. In yet another alternative, the parallelizer 106 can be self-aligned to the light shielding film 104 by inserting the light shielding film 104 into grooves 118 formed between the respective optical lenses 116 of the parallelizer 106, as shown in FIG. 5.

The mask 108 includes a transparent mask substrate 108a, and a mask pattern 108b formed on the mask substrate 108a. Shielding regions, in which the mask pattern 108b is formed, shield the parallel rays from the parallelizer 106, and transmitting regions, in which the mask pattern 108b is not formed, transmit the parallel rays. A pattern indicating the transmitting and shielding regions is transcribed on the photosensitive film by the rays passed through the transmitting regions of the mask 108.

Figure 6:
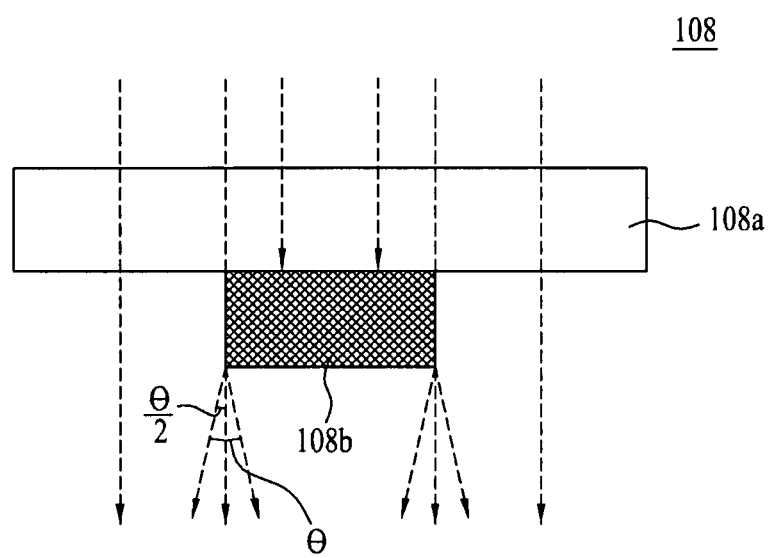
FIG. 6 is a cross-sectional view illustrating a mask shown in FIG. 1.

The parallel rays from the parallelizer 106 on the edge of the mask pattern 108b of the mask 108 have a collimation half angle (θ/2) of 20 degrees or less, as shown in FIG. 6. Here, the collimation half angle (θ/2) indicates the spreading degree of the parallel rays. The photosensitive film is patterned so as to have a tapered angle of 90~110 degrees through a photolithography process using the mask 108.

Figure 7:
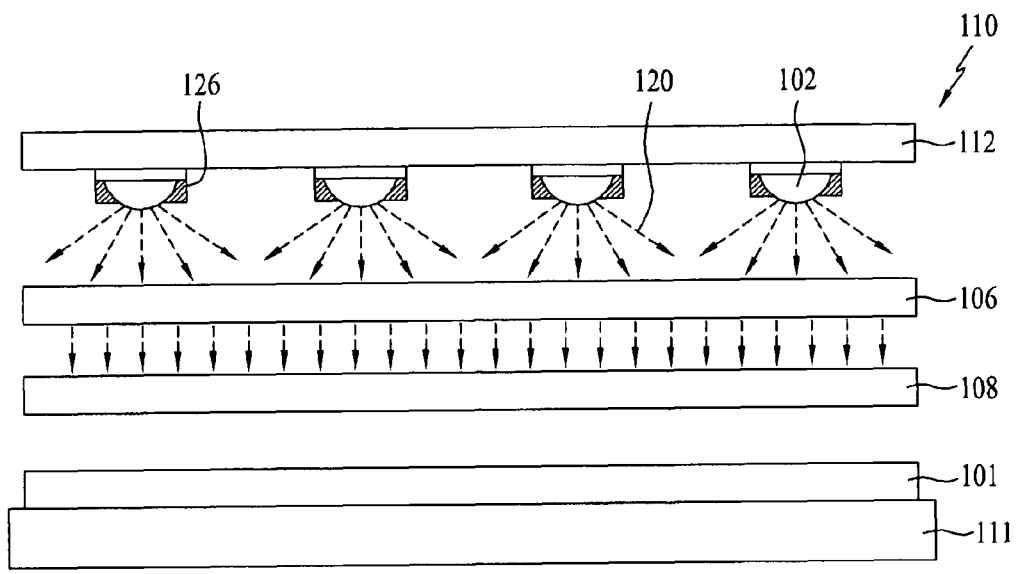
FIG. 7 is a cross-sectional view of an exposure apparatus in accordance with a second embodiment of the invention.

FIG. 7 is a cross-sectional view of an exposure apparatus in accordance with a second embodiment of the invention. As shown in FIG. 7, the exposure apparatus includes the same components as those of the exposure apparatus shown in FIG. 1 except that a light shielding film of the exposure apparatus of FIG. 7 coats the outer portions of light emitting surfaces of LEDs. Thus, a detailed description of components in the exposure apparatus of this embodiment, which are substantially the same as those in the first embodiment, will be omitted.

Figure 8:
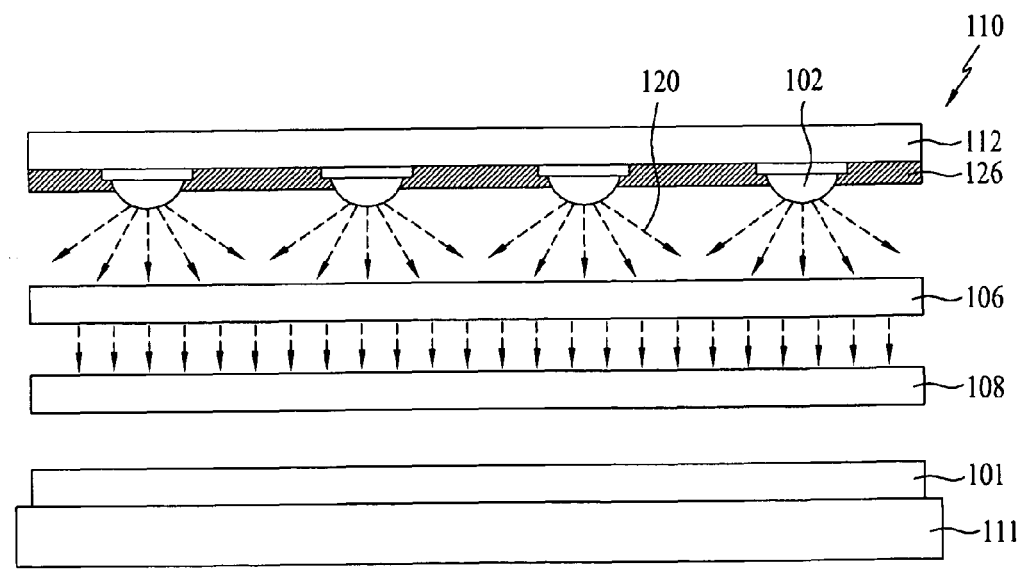
FIG. 8 is a cross-sectional view illustrating another embodiment of a light shielding film shown in FIG. 7.
Figure 9:
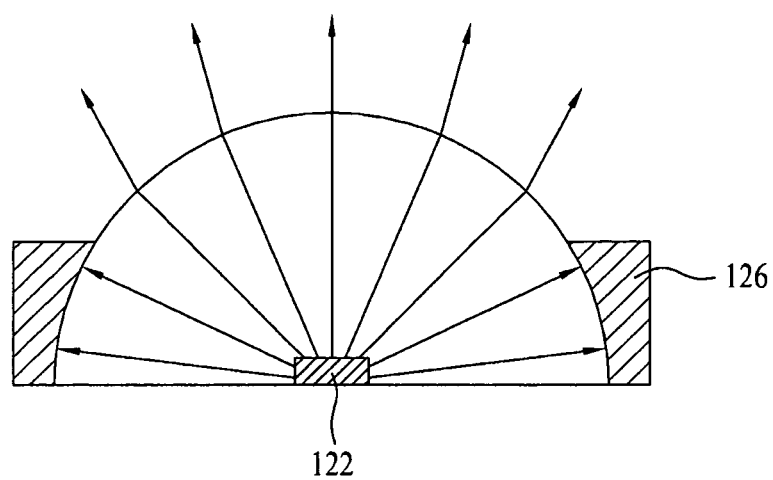
FIG. 9 is a cross-sectional view illustrating an LED shown in FIGS. 7 and 8.

A light shielding film 126 coats the outer portions or peripheral portions of the light emitting surfaces of the LEDs 102, as shown in FIG. 7, or coats the outer portions of the light emitting surfaces of the LEDs 102 and the printed circuit board 112 between the LEDs 102, as shown in FIG. 8. Specifically, the light shielding film 126 coats the outer portion of the light emitting surface with a dielectric substance 124 that protects a light emitting chip 122 generating ultraviolet rays, as shown in FIG. 9. Thus, rays are emitted from the remaining uncovered light emitting surfaces of the LEDs 102 except for the outer portions covered by the light shielding film 126.

As described above, the light shielding film 126 is formed at the outer portions of the light emitting surfaces of the LEDs 102, which can emit unwanted rays 120 that cause noise, and prevents the emission of the unwanted rays 120. That is, the light shielding film 126 shields the unwanted rays 120 emitted from the outer portions of the light emitting surfaces of the respective LEDs 102 such that the unwanted rays 120 emitted from the outer portions of the light emitting surfaces of the respective LEDs 102 cannot be incident upon the light emitting regions of the neighboring LEDs 102. When the unwanted rays 120 of the LEDs 102 are incident upon the light emitting regions 114 of the neighboring LEDs 102, the unwanted rays 120 act as noise. For this reason, the light shielding film 126 is made of a light absorptive material.

Figure 10:
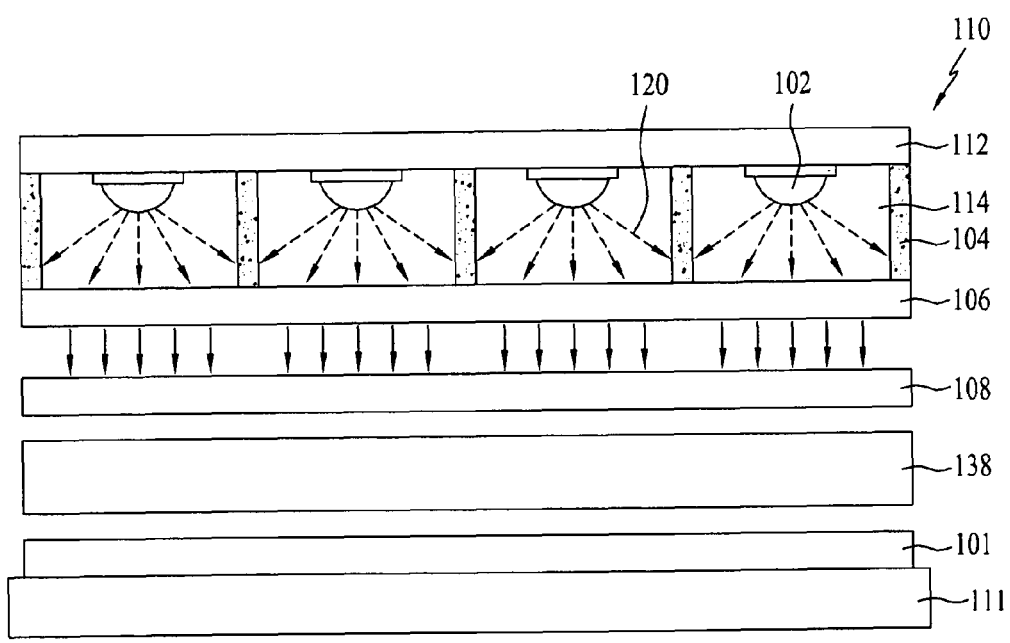
FIG. 10 is a cross-sectional view of an exposure apparatus in accordance with a third embodiment of the invention.

FIG. 10 is a cross-sectional view of an exposure apparatus in accordance with a third embodiment of the invention. As shown in FIG. 10, the exposure apparatus includes the same components as those of the exposure apparatus shown in FIG. 1 except that the exposure apparatus of FIG. 10 further includes a projection optical system 138. Thus, a detailed description of components in the exposure apparatus of this embodiment, which are substantially the same as those in the first embodiment, will be omitted.

The projection optical system 138 shown in FIG. 10 is formed between the mask 108 and the substrate 101, to which a photosensitive film is applied. Particularly, a thin film of a thin film transistor substrate is patterned using the exposure apparatus 110 having the projection optical system 138. Since it is difficult to obtain a desired pattern having a high resolution through proximity exposure, and the size of the substrate contracts or expands by several tens to several hundreds of ppm due to heat treatment of thin films of the thin film transistor substrate, for example, a metal layer and a semiconductor layer, required by a deposition method, such as CVD or sputtering.

In embodiments of the invention, the photosensitive film is exposed using the exposure apparatus having the projection optical system 138 to form a fine pattern having a high resolution, which cannot be formed through proximity exposure. Because the projection optical system 138 revises the rays from the mask 108 in consideration of contraction/expansion degree of the substrate 101 and the photosensitive film is exposed using the revised rays, the reduction of the line width of the photosensitive film due to heat treatment during a depositing process can be prevented.

Figure 11:
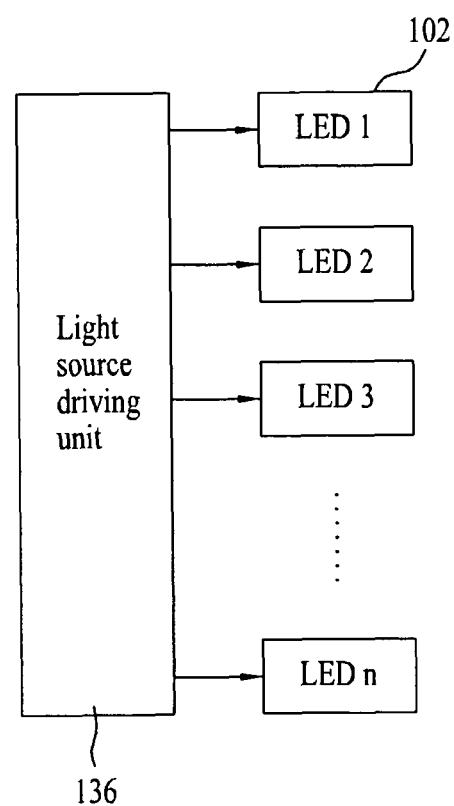
FIG. 11 is a block diagram illustrating a light source driving unit for driving LEDs of the exposure apparatuses in accordance with the first to third embodiments of the invention.

The LEDs of the exposure apparatuses in accordance with the first to third embodiments of the invention are driven by a light source driving unit 136 shown in FIG. 11. The light source driving unit 136 shown in FIG. 11 drives the plural LEDs 102 separately or collectively. The light source driving unit 136 controls driving current or driving voltage supplied to the LEDs 102, and thus controls optical output of the LEDs 102.

Figure 12:
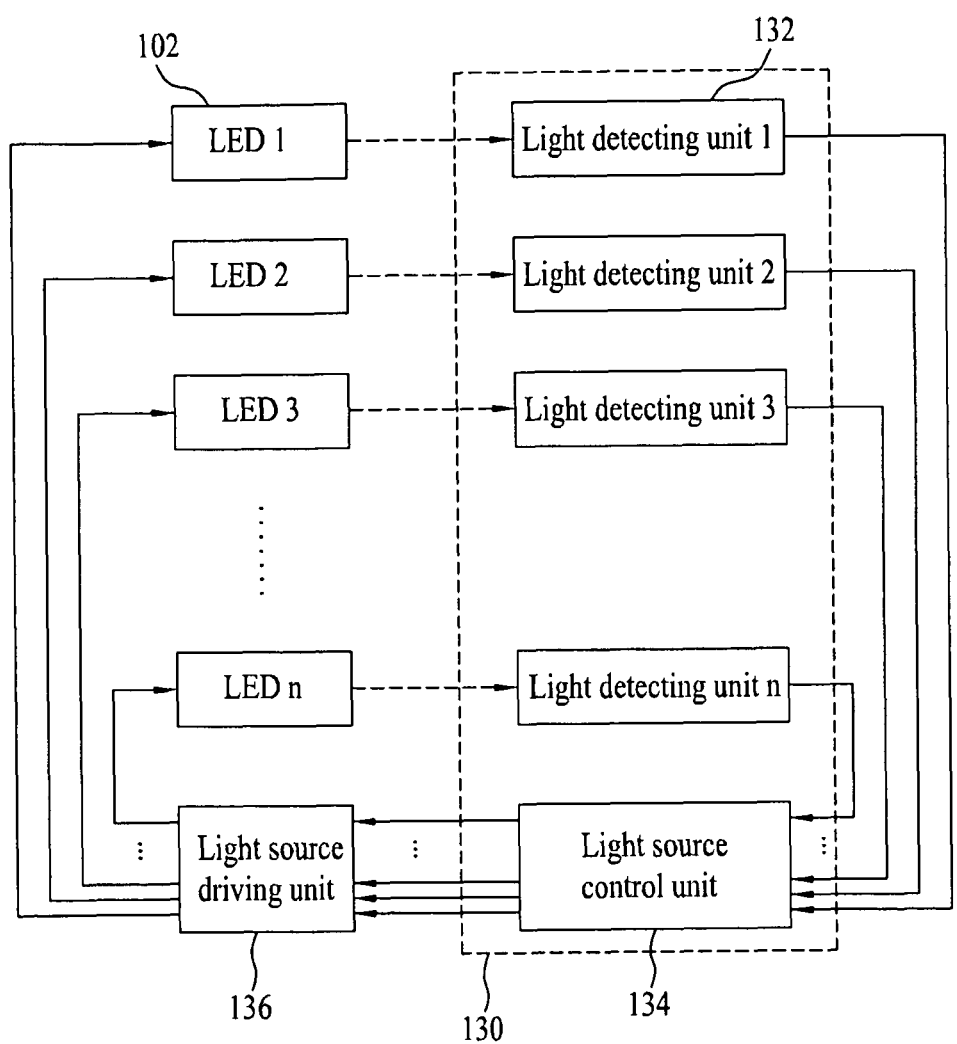
FIG. 12 is a block diagram illustrating a first embodiment of a light adjusting unit for adjusting the amount of rays of LEDs of the exposure apparatuses in accordance with the first to third embodiments of the invention.
Figure 13:
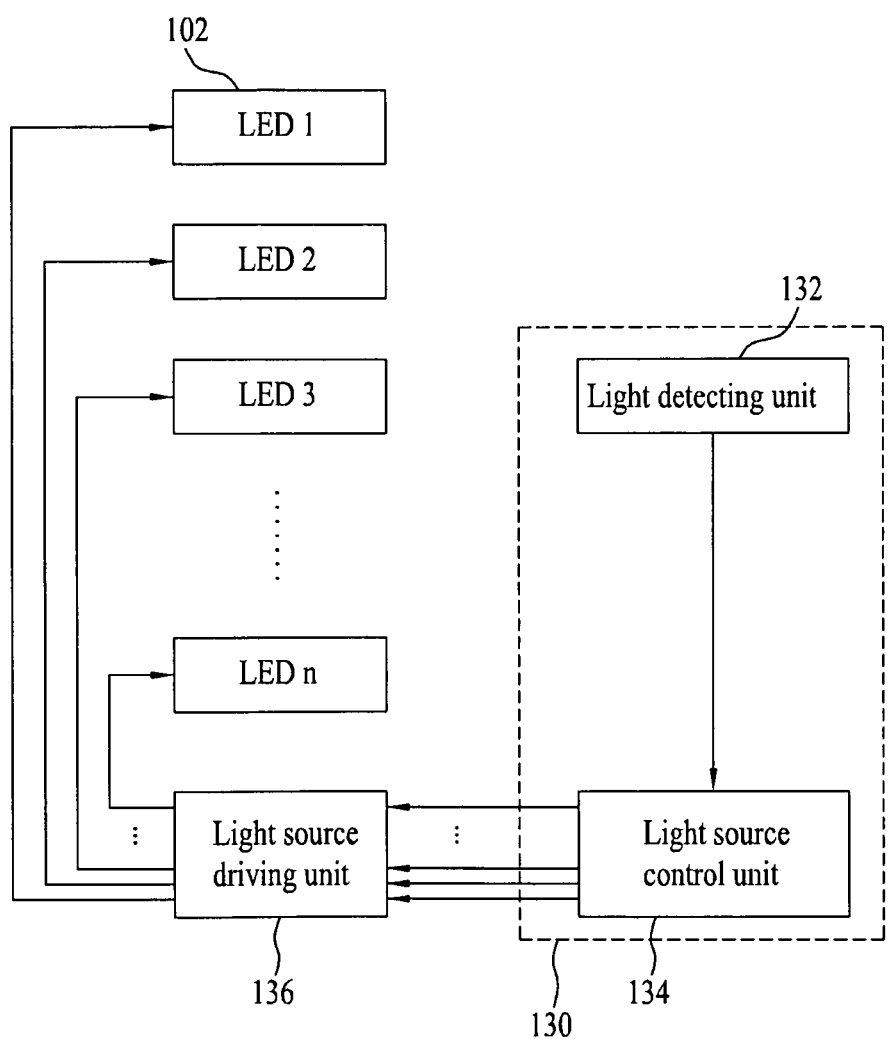
FIG. 13 is a block diagram illustrating a second embodiment of a light adjusting unit for adjusting the amount of rays of LEDs of the exposure apparatuses in accordance with the first to third embodiments of the invention.

As shown in FIGS. 12 and 13, the exposure apparatus of embodiments of the invention can further include a light adjusting unit 130 so as to uniformly control the amount of rays emitted from the respective LEDs 102. The light adjusting unit 130, as shown in FIGS. 12 and 13, includes at least one light detecting unit 132 and a light source control unit 134.

The at least one light detecting unit 132 measures the amount of rays emitted from the LEDs 102 of the exposure apparatuses in accordance with the first to third embodiments of the invention. Here, a plurality of light detecting units 132 corresponding to the LEDs 102 in a one to one relationship measures the amounts of rays emitted from the respective LEDs 102, as shown in FIG. 12. In the alternative, one light detecting unit 132 can correspond to many LEDs 102 and measure the amount of rays emitted from the LEDs 102, as shown in FIG. 13.

The light source control unit 134 generates a light source control signal based on the amount of rays measured by the at least one light detecting unit 132. That is, the light source control unit 134 compares the measured amount of rays to a predetermined reference amount of rays, and generates a light source control signal corresponding to a difference therebetween.

The light source driving unit 136 drives the plural LEDs 102 separately or collectively. The light source driving unit 136 controls the driving current or the driving voltage supplied to the LEDs 102 in response to the light source control signal, and thus controls the optical output of the LEDs 102. Hereinafter, the light source driving unit 136, which controls the driving current supplied to the LEDs 102, will be described. In the case that the measured amount of rays emitted from the LEDs 102 is smaller than the predetermined reference amount of rays and the LEDs 102 achieve a relatively low luminance, the light source driving unit 136 increases the driving current supplied to the LEDs 102 achieving the relatively low luminance. Then, the LEDs 102 achieve an increased luminance, and thus satisfy a reference luminance. On the other hand, in the case that the measured amount of rays emitted from the LEDs 102 is larger than the reference amount of rays and the LEDs 102 achieve a relatively high luminance, the light source driving unit 136 decreases the driving current supplied to the LEDs 102 achieving the relatively high luminance. Then, the LEDs 102 achieve a decreased luminance, and thus satisfy the reference luminance. To adjust the driving current supplied to the LEDs 102, the on/off switch (not shown) of the light source driving unit 136, connected to the LEDs 102, is controlled. That is, the duty ratio or the frequency of a pulse controlling the on/off switch is adjusted. Thereby, the total luminance of rays emitted from the LEDs 102 of the exposure apparatus of embodiments of the invention is uniformly maintained.

Figure 14:
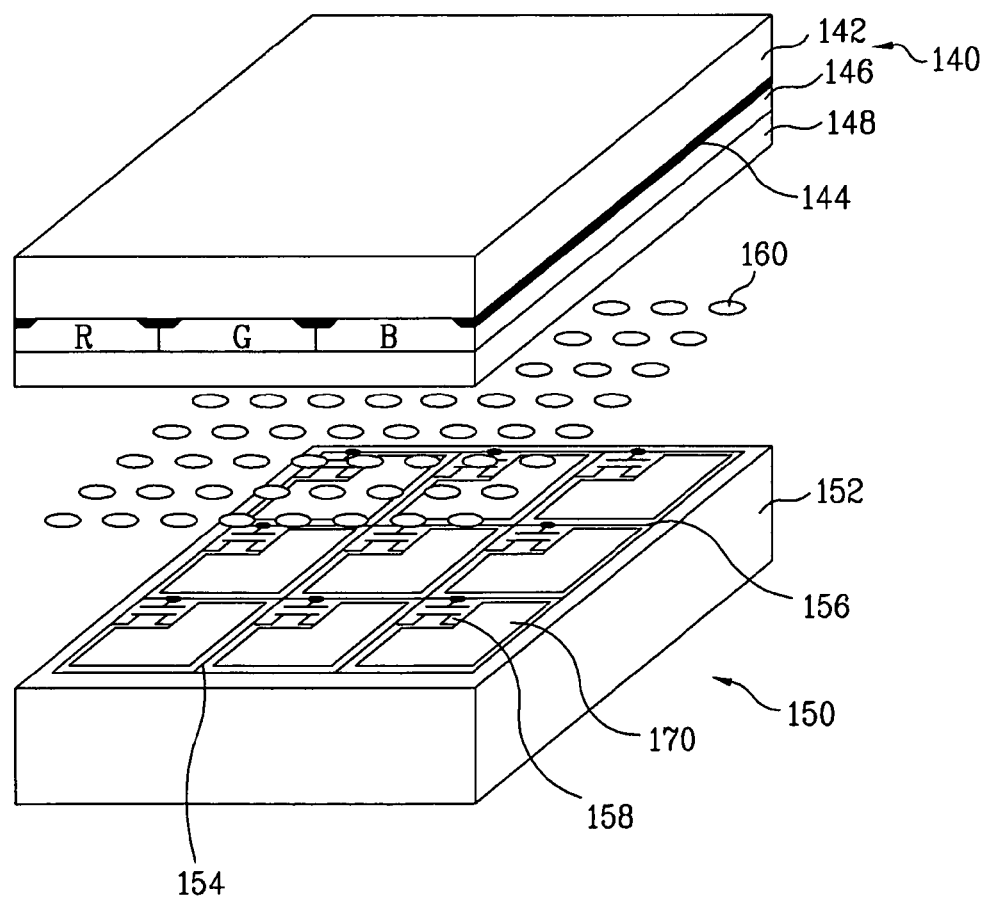
FIG. 14 is a perspective view illustrating a liquid crystal panel having a plurality of thin films formed by a photolithography process using an exposure apparatus in accordance with one embodiment of the invention.

FIG. 14 is a perspective view illustrating a liquid crystal panel having a plurality of thin films and thick films formed by a photolithography process using an exposure apparatus in accordance with one embodiment of the invention. The liquid crystal panel of embodiments of the invention shown in FIG. 14 includes a thin film transistor substrate 150 and a color filter substrate 140, which are bonded to each other with a liquid crystal layer 160 interposed therebetween.

The color filter substrate 140 includes a black matrix 144, color filters 146, a common electrode 148, and a column spacer (not shown), which are sequentially formed on an upper substrate 142. The black matrix 144 divides the upper substrate 142 into a plurality of cell regions, at which the color filters 146 are formed, and prevents the optical interference of neighboring cells and the reflection of external rays. The color filters 146, which are divided into red (R), green (G), and blue (B) color filters, are respectively formed at the cell regions divided by the black matrix 114, and respectively transmit R,
G, and B rays. The common electrode 148 is a transparent conductive layer, which supplies common voltage (Vcom) serving as a reference when liquid crystals are driven. The column spacer serves to uniformly maintain a cell gap between the thin film transistor substrate 150 and the color filter substrate 140. The thin film transistor substrate 150 includes gate lines 156 and data lines 154 formed on a lower substrate 152 such that they cross each other, thin film transistors 158 being respectively adjacent to the crossings, and pixel electrodes 170 respectively formed in pixel regions formed by the crossing structures.

The thin film transistors 158 cause pixel signals, supplied to the data lines 154 in response to scan signals supplied to the gate lines 156, to fill the pixel electrodes 170, and maintain the filling state of the pixel electrodes 170. The pixel electrodes 170 accept the pixel signals supplied from the thin film transistors 158, and generate a potential difference with the common electrode 148 formed on the color filter substrate 140. Due to the potential difference, the liquid crystal molecules located between the thin film transistor substrate 150 and the color filter substrate 140 are rotated by dielectric anisotropy, and the amount of incident rays from a backlight unit via the pixel electrodes 170 is adjusted and then the rays pass through the color filter substrate 140.

Non-photosensitive films of the thin film transistor substrate and the color filter substrate, for example, a conductive layer, and a semiconductor layer are patterned by an etching process using a photosensitive film patterned by a photolithography process using the exposure apparatuses in accordance with the first to third embodiments of the present invention. Specifically, the photosensitive film formed on the non-photosensitive films is exposed by redirecting generated from the LEDs of the exposure apparatus in accordance with any one of the first to third embodiments of the invention, into parallel rays and irradiating the parallel rays onto the photosensitive film through a mask. The exposed photosensitive film is patterned through a developing process, thus producing a photosensitive pattern. The non-photosensitive films are patterned through an etching process using the photosensitive pattern as a mask.

A photosensitive film, for example, color filters, of a thin film transistor substrate or a color substrate is patterned by a photolithography process using the exposure apparatuses in accordance with first to third embodiments of the invention. Specifically, the photosensitive film is exposed by redirecting rays generated from the LEDs of the exposure apparatus in accordance with any one of the first to third embodiments of the invention into parallel rays and irradiating the parallel rays onto the photosensitive film through a mask. The exposed photosensitive film is patterned through a developing process.

Thin films or thick films of other flat panel displays, such as a plasma display panel, an electro-luminescence display, and a field emission display, as well as the above-described liquid crystal display panel are formed by a photolithography process using the exposure apparatus of embodiments of the invention.

As described above, embodiments of the invention use LEDs having a long lifetime as a light source, and thereby drastically reducing the cost of maintenance, improving productivity, and reducing replacement processes. Further, embodiments of the invention use LEDs emitting rays of short wavelength that do not require an optical filter or a shutter so as to render a simple structure having a smaller size that reduces installation expenses. Furthermore, the embodiments of the invention use LEDs capable of being turned on and off, thereby reducing power consumption. In addition, embodiments of the invention do not use a discharge lamp using harmful discharge gas, such as mercury, and thus are environmentally benign. Moreover, embodiments of the invention shield unwanted rays out of the LEDs, to maintain the uniformity of rays emitted from the LEDs.

It will be apparent to those skilled in the art that various modifications and variations can be made in embodiments of the invention without departing from the spirit or scope of the invention. Thus, it is intended that embodiments of the invention cover the modifications and variations of this invention provided they come within the scope of the appended claims and their equivalents.

What is claimed is:

1. An exposure apparatus for a photosensitive film, comprising:
    light-emitting diodes for generating rays to expose a photosensitive film, wherein each of the light-emitting diodes includes a light emitting chip;
    a light shielding film positioned between the light-emitting diodes to prevent noise, wherein the light shielding film is made of a light absorptive material;
    a stage for receiving a substrate having the photosensitive film thereon; and
    a parallelizer positioned between the light-emitting diodes and the stage,
    wherein the parallelizer redirects the rays from the light-emitting diodes into parallel rays,
    wherein the light shielding film coats outer portions of light-emitting surfaces of the light-emitting diodes and a heat-radiating circuit board between the light-emitting diodes, or outer portions of light-emitting surfaces of the light-emitting diodes,
    wherein each of light-emitting surfaces of the light-emitting diodes has a spherical convex surface and the light shielding film coats part of the spherical convex surface of the light-emitting diode, and
    wherein a height of the light shielding film opposite to side surfaces of the light emitting chip is higher than the light emitting chip.

2. The exposure apparatus for a photosensitive film of claim 1, further comprising a mask positioned between the parallelizer and the stage.

3. The exposure apparatus for a photosensitive film of claim 1, wherein the light-emitting diodes are in a matrix array.

4. The exposure apparatus for a photosensitive film of claim 1, wherein the light-emitting diodes are mounted on the heat-radiating circuit board that dissipates heat generated by the light-emitting diodes.

5. The exposure apparatus for a photosensitive film of claim 1, wherein the parallelizer has optical lenses corresponding to the light-emitting diodes, respectively.

6. The exposure apparatus for a photosensitive film of claim 5, wherein each of the optical lenses has a first width greater than a second width of the light-emitting diode.

7. The exposure apparatus for a photosensitive film of claim 5, wherein each of the optical lenses has an aspherical convex surface.

8. The exposure apparatus for a photosensitive film of claim 5, wherein each of the optical lenses has a concave surface and a convex surface.

9. The exposure apparatus for a photosensitive film of claim 1, further comprising a projection optical system positioned between the parallelizer and the stage.

10. The exposure apparatus for a photosensitive film of claim 1, further comprising a temperature sensor for sensing a temperature of the exposure apparatus and a temperature control unit for increasing or decreasing the temperature of the exposure apparatus.

11. The exposure apparatus for a photosensitive film of claim 1, further comprising at least one light detecting unit for measuring an amount of rays emitted from the light-emitting diodes of the exposure apparatus.

12. The exposure apparatus for a photosensitive film of claim 1, further comprising a plurality of light detecting units corresponding to the light-emitting diodes in a one to one relationship for measuring amounts of rays emitted from the light-emitting diodes, respectively.

* * * * *